US008558565B2

(12) United States Patent  
Yassine et al.

(10) Patent No.: US 8,558,565 B2  
(45) Date of Patent: Oct. 15, 2013

(54) WIDE AREA SOFT DEFECT LOCALIZATION

(75) Inventors: Abdullah M. Yassine, Austin, TX (US); Rama Rao Goruganthu, Austin, TX (US); Shannon B. Smith, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 363 days.

(21) Appl. No.: 13/026,918

(22) Filed: Feb. 14, 2011

(65) Prior Publication Data

US 2012/0206158 A1    Aug. 16, 2012

(51) Int. Cl.  
*G01R 31/00* (2006.01)

(52) U.S. Cl.  
USPC ............... 324/750.16; 324/765; 356/237.2

(58) Field of Classification Search  
USPC .............. 324/750.16, 765; 714/732; 356/237.1–237.6, 601–614; 250/237 R, 250/341.1  
See application file for complete search history.

(56) References Cited

U.S. PATENT DOCUMENTS

| | | | |
|---|---|---|---|
| 5,171,490 A * | 12/1992 | Fudim | 264/401 |
| 7,969,564 B2 * | 6/2011 | Almogy et al. | 356/237.2 |
| 2009/0302880 A1 * | 12/2009 | Potok et al. | 324/765 |

OTHER PUBLICATIONS

Bruce et al., Soft Defect Localization (SDL) in Integrated Circuits using Laser Scanning Microscopy, IEEE, 2003, 662-663.*  
Sienkiewcz et al., Methodology to support laser-localized soft defects on analog and mixed mode advanced IC's, IEEE, 2009, 322-326.*

* cited by examiner

*Primary Examiner* — Patrick Assouad  
*Assistant Examiner* — Sean Curtis  
(74) *Attorney, Agent, or Firm* — Abel Law Group, LLP

(57) ABSTRACT

Various apparatus and methods of testing a semiconductor chip for soft defects are disclosed. In one aspect, a method of testing a semiconductor chip that has a surface and plural circuit structures positioned beneath the surface is provided. An irradiation mask directs light or heat to a series of fractional portions of the surface to perturb portions of the plural circuit structures. The irradiation mask is adjustable such that at least one of the exposed series of fractional portions is smaller than another of the series of fractional portions. The semiconductor chip undergoes a test pattern during the irradiation to each of the fractional portions to determine if a soft defect exists in any of the series of fractional portions. Multiple paths can be tested simultaneously to inform subsequent individual CTP path tests.

21 Claims, 15 Drawing Sheets

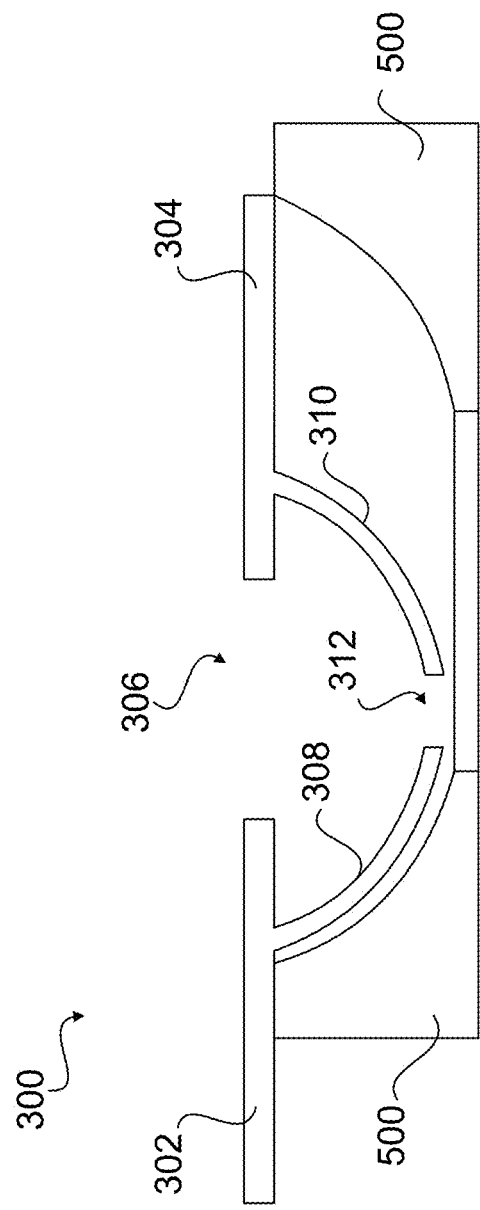

F = 2.652 GHz, T = 18 C, Vdd = 0.98V, VddNB = 1.0V using Hummer4C program.

| Test# | M1 (X,Y) | M2 (X,Y) | Heat Source | Count | Pass | Fail | Duration | P% | F% | |
|---|---|---|---|---|---|---|---|---|---|---|
| 1 | 0.0, 0.0 | 0.0, 0.0 | No heat | 3063 | 1550 | 1548 | 1min | 50.6 | 50.5 | |
| 2 | 0.0, 0.0 | 0.0, 0.0 | No heat | 3280 | 2033 | 1248 | 1min | 62.0 | 38.0 | |
| 3 | 0.0, 0.0 | 0.0, 0.0 | No heat | 3177 | 1796 | 1381 | 1min | 56.5 | 43.5 | |
| 4 | 0.0, 0.0 | 0.0, 0.0 | No heat | 3103 | 1733 | 1370 | 1min | 55.8 | 44.2 | |
| 5 | 0.0, 0.0 | 0.0, 0.0 | 13V IR | 3607 | 2672 | 934 | 1min | 74.1 | 25.9 | |
| 5 | 0.0, 0.0 | 0.0, 0.0 | 14V IR | 3536 | 2512 | 1024 | 1min | 71.0 | 29.0 | |
| 6 | 0.0, 0.0 | 0.0, 0.0 | 15V IR | 3415 | 2440 | 978 | 1min | 71.4 | 28.6 | |
| 7 | 0.0, 0.0 | 0.0, 0.0 | Hera (80V) | 3772 | 3026 | 745 | 1min | 80.2 | 19.8 | |
| 8 | 0.0, 0.0 | 0.0, 0.0 | No heat | 3021 | 1597 | 1424 | 1min | 52.9 | 47.1 | Core 0 & 1 |
| 9 | 0.0, -8.9 | 0.0, -8.9 | Hera (80V) | 3494 | 2494 | 999 | 1min | 71.4 | 28.6 | |
| 10 | 0.0, -8.9 | 0.0, -8.9 | 13V IR | 3199 | 1878 | 1321 | 1min | 58.7 | 41.3 | |
| 11 | 0.0, 0.0 | 0.0, -8.9 | No heat | 2972 | 1424 | 1548 | 1min | 47.9 | 52.1 | Core 2 & 3 |
| 12 | 0.0, 0.0 | 0.0, -8.9 | 13V IR | 3648 | 2692 | 956 | 1min | 73.8 | 26.2 | |
| 13 | 0.0, 0.0 | 0.0, -8.9 | Hera (80V) | 3644 | 2708 | 916 | 1min | 74.3 | 25.1 | |
| 14 | 6.8, 0.0 | 0.0, -8.9 | No heat | 2855 | 1203 | 1652 | 1min | 42.1 | 57.9 | |
| 15 | 6.8, 0.0 | 0.0, -8.9 | 13V IR | 3340 | 2173 | 1166 | 1min | 65.1 | 34.8 | |
| 16 | 6.8, 0.0 | 0.0, -8.9 | 14V IR | 3494 | 2483 | 1011 | 1min | 71.1 | 28.9 | |
| 17 | 6.8, 0.0 | 0.0, -8.9 | Hera (80V) | 3677 | 2839 | 838 | 1min | 77.2 | 22.8 | Core 2 |
| 18 | 0.0, 0.0 | 6.8, -8.9 | No heat | 3127 | 1735 | 1392 | 1min | 55.5 | 44.5 | |
| 19 | 0.0, 0.0 | 6.8, -8.9 | Hera (80V) | 3965 | 3309 | 656 | 1min | 83.5 | 16.5 | Core 3 |
| 20 | 0.0, 0.0 | 6.8, -8.9 | 14V IR | 3407 | 2315 | 1092 | 1min | 67.9 | 32.1 | |
| 21 | 0.0, 0.0 | 6.8, -8.9 | 13V IR | 3403 | 2311 | 1092 | 1min | 67.9 | 32.1 | |
| 22 | 0.0, 0.0 | 10.0, -8.9 | No heat | 3247 | 1758 | 1489 | 1min | 54.1 | 45.9 | |
| 23 | 0.0, 0.0 | 10.0, -8.9 | No heat | 3193 | 1836 | 1357 | 1min | 57.5 | 42.5 | |
| 24 | 0.0, 0.0 | 10.0, -8.9 | Hera (80V) | 3772 | 2899 | 873 | 1min | 76.9 | 23.1 | |
| 25 | 10.0, 0.0 | 0.0, -8.9 | No heat | 3248 | 1870 | 1378 | 1min | 57.6 | 42.4 | |
| 26 | 10.0, 0.0 | 0.0, -8.9 | No heat | 3125 | 1652 | 1473 | 1min | 52.9 | 47.1 | |
| 27 | 10.0, 0.0 | 0.0, -8.9 | Hera (80V) | 3631 | 2798 | 832 | 1min | 77.1 | 22.9 | Core 2 |

FIG. 19

WIDE AREA SOFT DEFECT LOCALIZATION

BACKGROUND

1. Field of the Invention

This invention relates generally to semiconductor processing, and more particularly to methods and apparatus for testing semiconductor chips.

2. Description of the Related Art

Soft defect isolation techniques are critical to the development and manufacture of large-scale integrated circuits such as processors. Examples of such techniques include those methodologies which exploit induced voltage alterations, such as Thermally Induced Voltage Alteration ("TIVA"), Light Induced Voltage Alteration ("LIVA") and Charge Induced Voltage Alteration ("CIVA"). The basic setup for these techniques uses a constant current source for biasing the device under test ("DUT") and a detector to sense the change in the voltage demand due to the localized heating, light stimulation by the laser or charge stimulation by an e-beam.

Another soft defect testing variant uses a scanning laser microscope to scan over the entire surface of a die on a pixel-by-pixel basis. While the laser spot dwells on a given pixel, a test computer causes the die to execute a test pattern or script. The laser radiation causes a local perturbation to the circuit. If a soft defect coincides with the location of the laser spot, then the test pattern will register an anomaly and the pixel location on the die in question will be flagged for further fault analysis.

Testing time is a limitation associated with the pixel-by-pixel approach. The test pattern must be run at least once for each pixel. The number of pixels that must be scanned individually for a given die will depend on the die size and the field of view of the laser microscope. A typical field of view is 512.times.512 pixels at a 5 times magnification. Under such conditions, a 1 cm.times.1 cm die will require the field of view to be moved twenty-five times to fully cover the die. Even though current test patterns require perhaps a few microseconds to a few milliseconds to run, the time for each test pattern multiplied by the sheer number of pixels can lead to hours or even days of testing time to locate just one soft defect. Care must also be taken into account for the potential for the scanning technique to produce a discontinuity between the length of time that the incident radiation beam strikes a given pixel and the response time of the signal detection circuitry. If the illumination time per pixel is less than the response time of the signal detection circuitry, then the sensed signal will tend to smear into adjacent pixels and produce a characteristic tail pattern that can obscure the behavior of adjacent structures.

One conventional technique to address the issue of testing time involves test pattern construction. Long and complex test patterns have the benefit of more fully exercising the circuits of the die and thus revealing more types of soft defects, particularly those that present very subtle characteristics. However, as a time saver, conventional test patterns are deliberately written to be relatively short, which limits the number and complexity of critical timing paths or soft defects that may be analyzed.

The present invention is directed to overcoming or reducing the effects of one or more of the foregoing disadvantages.

SUMMARY OF EMBODIMENTS OF THE INVENTION

It has been discovered that a mobile Global Critical Timing Path ("GCTP") platform can facilitate use of Critical Timing Path ("CTP") techniques and systems with ATE, HST and SLT testers for circuit debugging and fault isolation in single chip and multi-chip modules.

In accordance with one aspect of the invention, a mobile GCTP platform can be docked with an ATE test head or can be used as a standalone system with an SLT board or HST board for system level testing to debug a circuit or isolate a fault area on a chip. A mobile telescoping support base allows the mobile GCTP platform to be aligned with, lowered onto or otherwise positioned on an ATE test head or table on which an SLT or HST board is positioned. The mobile GCTP platform can also be detached from the mobile telescoping support base after docking to the ATE test head.

In some implementations, the mobile GCTP platform includes an irradiation source, and adjustable aperture irradiation mask, and an imaging apparatus. It has been discovered that a first larger upper mask aperture provides for sufficient IR beam irradiation, while a second smaller lower mask aperture provides for precise control of exposure of the die area and of spreading or diffusion of the irradiation beam.

It has been further discovered that the irradiation mask and apertures can be adjusted using an upper set of overlapping mask portions jointly defining an aperture positionable to selectively excite a range of circuit surface area sizes with irradiation, e.g., IR beams, light or heat, for soft defect testing. A corresponding second aperture is defined by second lower set of irradiation mask portions positioned below the first upper mask portion set to collimate the IR beam down to the die surface. Thus, the upper mask portions collect the IR beam energy in an upper aperture and block the IR beam energy from surrounding die surfaces while the lower mask portions precisely direct the IR beam energy to a defined target surface area and minimize spreading or diffusion of the IR beam energy outside the target surface area.

The mask portions can include adjustable complementary overlapping or nesting structures, e.g., L-shaped and/or tiered structures, to fully define the apertures and provide selected mask coverage. The masks can be supported by arms moveable by a multi-axis actuator and the arms can be pivotable to be retracted during testing set up, for example, when repositioning for change out of a die or for testing of a second die of a multi-chip set. The arms can be precisely controlled by the actuator and can further be manually rotatable or pivotable relative to the actuator, i.e., independent of actuator motion, for ease of alignment, mask change out, or die change out.

It has been discovered that the adjustable aperture masks and irradiation source allow the simultaneous excitation of multiple sites or paths to alter the behavior of a circuit chip. Multi-site or multi-path testing provides various advantages over traditional single path CTP tools, shortening the debugging time required to isolate speed paths or fault sites in an integrated circuit. For example, diminishing fractional section excitation areas can be used to rapidly approximate the location of a fault with the Global CTP system, which can then inform a more precise search using a traditional CTP system.

This approach optimizes the usage loads on expensive CTP systems, e.g., beta LICAT systems, by first narrowing the scope of the CTP test within a fault region identified using the Global CTP system. It has been determined through experimentation that problem areas can typically be identified in as few as 2-3 hours with the Global CTP system compared to the many hours required for fine pixel scans by traditional CTP systems. Automation of the mask actuators and actuators associated with the imaging apparatus and IR beams can significantly reduce testing cycles. Additionally, GCTP testing allows multiple paths/areas to be stimulated to reveal faults that single path CTP techniques may not reveal.

One aspect of the invention features a method of testing a semiconductor chip having a surface and plural circuit structures positioned beneath the surface. In some applications, the method includes positioning moveable complementary portions of an irradiation mask for selective irradiation of a series of fractional portions of the chip surface. The irradiation mask include an upper set of overlapping mask portions defining a first larger variable aperture and a set of lower mask portions defining a second smaller variable aperture for mitigating diffusion of radiation beyond a target fractional portion of the chip surface area. The method further includes selectively irradiating a series of fractional portions of the surface, the fractional portions defined via the positioning, to perturb respective circuit structures. The semiconductor chip undergoes tests during the irradiation of the fractional portions to determine if a soft defect exists in the respective circuit structures of any of the fractional portions.

In some applications, a first of the upper mask portions includes a stepped structure defining a first portion of the larger aperture and the second of the upper mask portions includes a complementary stepped structure defining a second portion of the larger aperture and the positioning includes overlapping the stepped portions to provide a substantially planar surface surrounding a major portion of the larger aperture.

In some applications, the positioning includes varying the size of at least one of the apertures between irradiation of at least two fractional portions.

In some applications, at least one of the series of fractional portions is smaller than another of the series of fractional portions.

In some applications, the tests include testing multiple circuit paths simultaneously. A subsequent single critical timing path test may be used to further isolate a soft defect to an individual one of the multiple circuit paths.

In some applications, the method includes positioning a cooling device adjacent the semiconductor chip during the irradiating, the cooling device including sidewalls defining a cavity. At least the lower mask portions are positioned within the cooling device cavity during the irradiation. A lower mask portion substantially conforms to a contour of the cavity to accommodate positioning of the lower mask portion in close proximity to the cavity sidewall. In some applications, an upper mask portion extends beyond the cavity while the lower mask portions are positionable substantially within the cavity during irradiation.

In some applications, the larger aperture is sized to collect a first amount of irradiation energy sufficient to perturb a target fractional portion and the smaller aperture is sized to precisely direct the collected irradiation energy to the target fractional portion. Varying a degree of overlap of the upper mask portions can vary the perimeter of the larger aperture.

Another aspect of the invention features an apparatus for testing a semiconductor chip having a surface and plural circuit structures positioned beneath the surface. In some implementations, the apparatus includes an irradiation source operable to stimulate a series of fractional portions of the surface to perturb respective circuit structures during soft defect testing. An irradiation mask including complementary upper mask portions is moveable in overlapping relation to define a first larger variable aperture and a set of lower mask portions moveable to define a second smaller variable aperture.

In some implementations, a first of the upper mask portions includes a stepped structure defining a first portion of the larger aperture and the second of the upper mask portions includes a complementary stepped structure defining a second portion of the larger aperture whereby the overlapped stepped portions together define a substantially planar surface surrounding a major portion of the larger aperture. In some cases, the lower mask portions overlap to define the smaller aperture to mitigate diffusion of radiation at the chip surface.

In some implementations, the apparatus includes a cooling device to cool the semiconductor chip during the irradiation; wherein the at least one of the lower mask portions is contoured to nest in close proximity to a cooling device contour during testing.

In some implementations, the lower mask portions are supported by the upper mask portions and extend inwardly beyond the perimeter of the larger aperture to define the smaller aperture.

In some implementations, the upper mask portions include opposed recesses defining the larger aperture when the upper mask portions are in a fully overlapped position.

In some implementations, the degree of overlap of the upper mask portions determines the size of the larger and smaller apertures.

Another aspect of the invention features a method for multi-path testing of fractional portions of a semiconductor chip having a surface and plural circuit structures. In some applications, the method includes positioning an irradiation source to irradiate the chip surface. The method further includes positioning an irradiation mask to direct irradiation energy from the irradiation source to select fractional portions of the chip surface during testing, the mask including adjustable portions defining first and second variable apertures, the first aperture positionable closer to the irradiation source to collect irradiation energy, the second aperture positionable closer to the chip surface to precisely direct the collected irradiation energy to a selected portion of the chip surface during testing. The method further includes simultaneously testing multiple paths within the circuit structures for soft defects while irradiating the chip surface.

In some applications, the method includes positioning the irradiation mask in close proximity to a cooling device adjacent the chip surface, wherein a contour of the irradiation mask substantially conforms to a contour of the cooling device to accommodate the close proximity positioning.

In some applications, the irradiating includes irradiation of substantially different wavelengths.

In accordance with one aspect of the present invention, a method of testing a semiconductor chip that has a surface and plural circuit structures positioned beneath the surface is provided. An external stimulus is applied to a series of fractional portions of the surface to perturb portions of the plural circuit structures such that at least one of the series of fractional portions is smaller than another of the series of fractional portions. The semiconductor chip is caused to perform a test pattern during the application of external stimulus to each of the fractional portions to determine if a soft defect exists in any of the series of fractional portions.

In accordance with another aspect of the present invention, a method of testing a semiconductor chip is provided that includes covering a first portion of the semiconductor chip while leaving a second portion exposed and applying an external stimulus to the second portion of the semiconductor chip. The semiconductor chip is caused to perform a test pattern during the application of the external stimulus to determine if a soft defect exists in the second portion of the semiconductor chip.

In accordance with another aspect of the present invention, an apparatus for testing a semiconductor chip that has a surface and plural circuit structures positioned beneath the surface is provided. A source of external stimulus is operable to stimulate a series of fractional portions of the surface to perturb portions of the plural circuit structures such that at least one of the series of fractional portions is smaller than another of the series of fractional portions. A computer system is electrically coupled to the semiconductor chip to cause the semiconductor chip to perform a test pattern during the application of external stimulus to each of the fractional portions to determine if a soft defect exists in any of the series of fractional portions.

BRIEF DESCRIPTION OF THE DRAWINGS

The present invention may be better understood, and its numerous objects, features, and advantages made apparent to those skilled in the art by referencing the accompanying drawings.

FIG. 18 depicts a side view of a defect scanning system including a cooling apparatus and an irradiation mask substantially conforming to a cooling apparatus contour.

FIG. 19 depicts sample test results from a defect scanning system using various irradiation sources.

The use of the same reference symbols in different drawings indicates similar or identical items.

DETAILED DESCRIPTION

Figure 1:
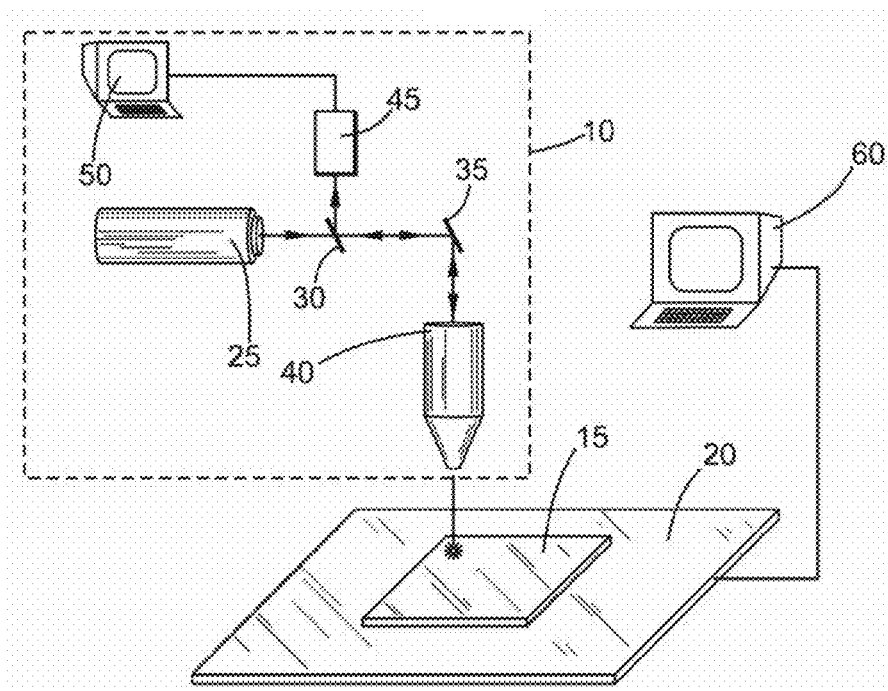
FIG. 1 is a pictorial view of an exemplary conventional laser scanning microscopy system.

In the drawings described below, reference numerals are generally repeated where identical elements appear in more than one figure. Before discussing the exemplary embodiments disclosed herein, it will be instructive to review briefly the structure and function of a conventional laser scanning/stimulation microscopy system. Turning now to the drawings, and in particular to FIG. 1, therein is shown a pictorial view of an exemplary conventional laser scanning microscopy system 10 (hereinafter laser system 10) that is configured to permit the laser scanning and stimulation of a semiconductor chip 15 mounted on a package substrate 20. The laser system 10 includes an infrared wavelength laser 25, a beam splitter 30, a movable positioning mirror 35, an objective lens 40, a photo detector 45 and a computer system 50. Infrared laser radiation 55 delivered from the laser 25 passes through the beam splitter 30 and is reflected through the objective lens 40 by way of the positioning mirror 35. The laser radiation 55 leaving the objective lens 40 is focused at selected positions on the semiconductor chip 15 for purposes of causing a local perturbation in the circuit structures of the semiconductor chip 15. The semiconductor chip 15 is electrically connected to a computer system or test system 60 that is operable to run certain electrical tests or patterns in the semiconductor chip 15 while the laser radiation 55 is focused on a particular spot of the chip 15. Infrared wavelengths are selected for this type of testing due to their ability to penetrate silicon. Even so, the chip 15 must usually be thinned or deprocessed prior to testing to remove various layers of oxide, passivation and other materials that are commonly applied to semiconductor chips and which could prevent the laser radiation from penetrating sufficiently to reach circuit structures.

The laser system 10 is not only operable to deliver laser radiation 55 to the semiconductor chip 15 for the purposes of circuit stimulation but also for the purposes of laser microscopy. Thus, laser radiation 55 reflects upward through the lens 40 and off the positioning mirror 35 to the back side of the beam splitter 30 and eventually into the photo detector 45, which produces output signals that are converted into an image in the computer system 50. The chip 15 and substrate 20 may be seated on a two-axis moveable stage (not shown).

Figure 2:
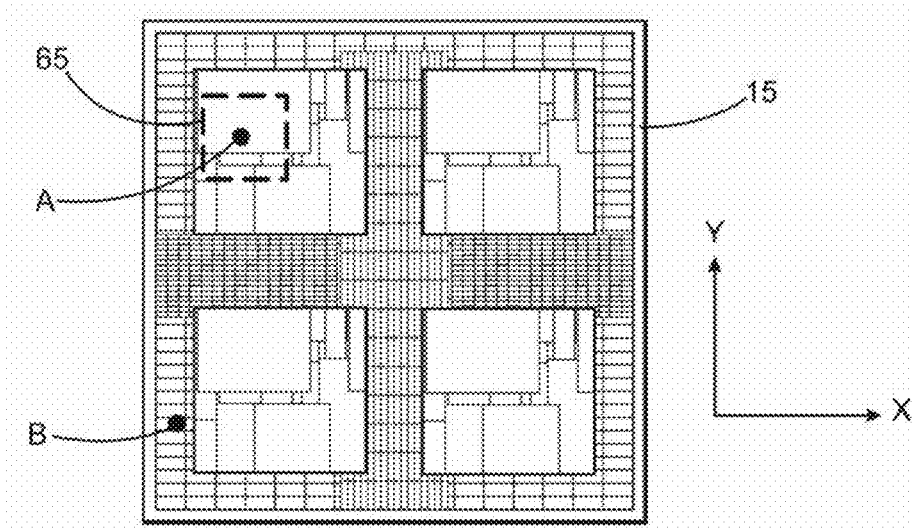
FIG. 2 is an overhead view of a semiconductor chip undergoing examination by the microscopy system depicted in FIG. 1.
Figure 3:
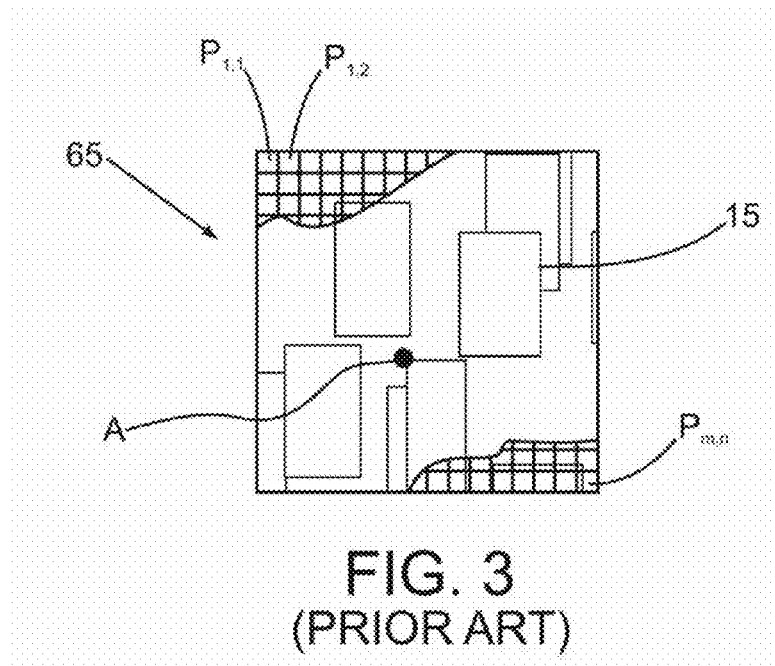
FIG. 3 is a magnified overhead view of a portion of the semiconductor chip.

To understand a conventional laser scanning defect technique, it will be useful to refer now also to FIG. 2, which is an overhead view of just the chip 15. The lens 40 depicted in FIG. 1 has a field of view that is represented by the dashed box 65 on the chip 15 in FIG. 2. The field of view 65 will have a physical size that is dependent upon the magnification level of the lens 40 depicted in FIG. 1 though usually smaller than the size of the chip 15. A higher magnification lens 40 will produce a smaller field of view 65. The locations of two hypothetical soft defects in the semiconductor chip 15 are labeled A and B, respectively. The hypothetical soft defect A is fortuitously located with the illustrated position of the field of view 65 of the lens 40. The soft defect B is not. To scan the chip 15 for soft defects, either the chip 15 or the lens 40 is moved to a certain position in the X-Y plane so that the field of view 65 corresponds to a selected location of the chip 15, such as the location of the field of view in FIG. 2. The portion of the chip 15 covered by the field of view 65 is shown at greater magnification in FIG. 3. The field of view 65 is subdivided into an array of some number of pixels $P_{1,1}, P_{1,2} \ldots P_{m,n}$. Note that most of the pixels $P_{1,1}, P_{1,2} \ldots P_{m,n}$ are shown cut away so that the location of the soft defect A is visible. One typical conventional field of view is subdivided into an array of 512.times.512 pixels. The laser 25 is sequentially activated at each of the pixels $P_{1,1}, P_{1,2} \ldots P_{m,n}$. During illumination at each given pixel, one or more test patterns or scripts are run by the computer system 60 to cause the chip 15 to perform various functions, such as floating point calculations, matrix manipulations, etc. The duration of typical conventional test patterns are normally on the order of a few microseconds to a few milliseconds. The laser radiation causes a perturbation in the chip circuitry at each pixel. If a soft defect, like the defect A, is encountered, a computational error will usually be detected by the computer system 60 and the offending pixel will be flagged. The chip 15 will then be subjected to a further testing to identify the source of the soft defect, e.g., process defect, design rule violation etc.

As noted in the Background section hereof, conventional laser soft defect scanning, e.g., NIR Laser Induced Circuit Alteration, can take hours or days to isolate fault or speed paths in integrated circuits. Examination of each of the pixels $P_{1,1}, P_{1,2} \ldots P_{m,n}$ within the array will require: (1) a small movement of either the chip 15 in the X-Y plane, or perhaps a movement of the laser radiation beam 55 if that is possible with the laser system 10 to each pixel; (2) the activation of the laser 25; and (3) the execution of the test pattern(s), and so on for the remainder of the chip 15. The sheer number of individual pixels that must be examined and the steps that must be taken for each pixel simply take time. If the soft defects A and B on the chip 15 happen to be positioned remotely from where the field of view 65 of the lens 40 is positioned during the initial phases of the test, significant time may be consumed before the positions of the defects A and B are located.

The conventional system 10 uses a fixed field of view and a fixed pixel array to test very small portions of the chip 15 one pixel at a time. The new wide area soft defect localization systems and techniques disclosed herein take a different approach. Instead of focusing on one pixel at a time, much larger fractional portions of a chip are subjected to perturbation and test patterning in order to quickly identify the location of a soft defect, say in one half fractional portion or one quadrant fractional portion of a chip. More focused testing can then be concentrated on the offending chip block. As a result, more time consuming pixel-by-pixel testing can be limited to smaller portions of a chip that have been previously identified as containing a soft defect.

Figure 4:
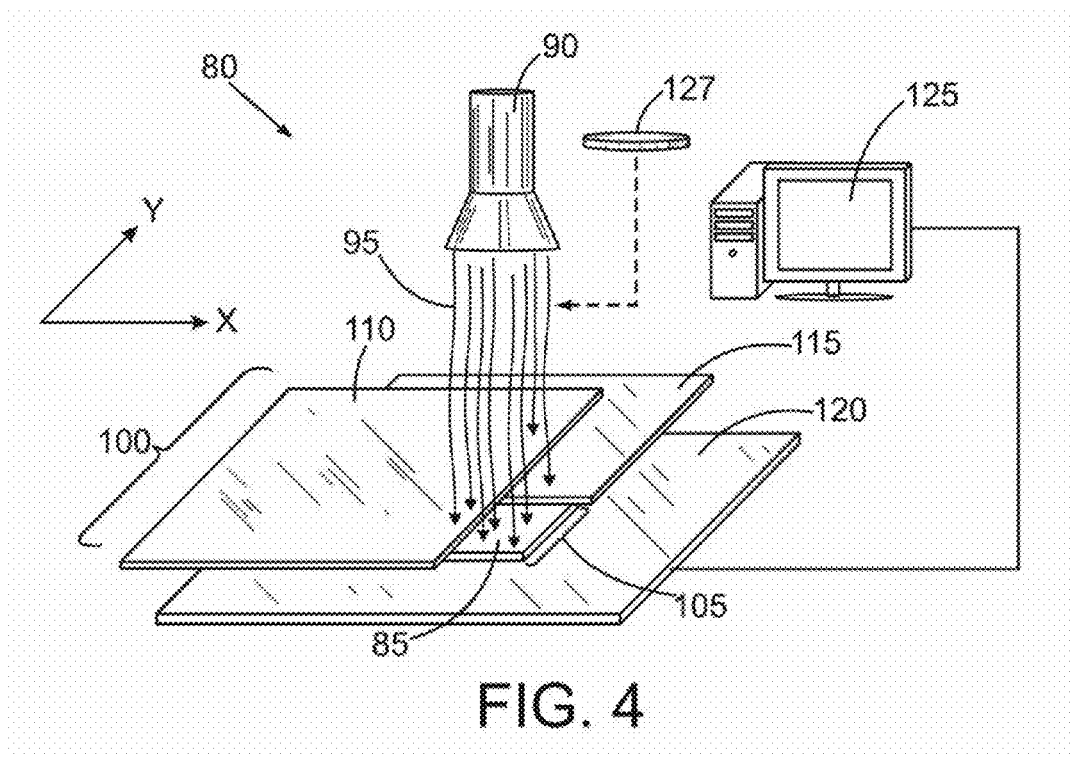
FIG. 4 is a pictorial view of an exemplary embodiment of a defect scanning system that is operable to detect soft defects in a semiconductor chip.

With that backdrop, attention is now turned to FIG. 4, which is a pictorial view of an exemplary embodiment of a defect scanning system 80 that is operable to enable relatively rapid detection of soft defects in a semiconductor chip 85. The system 80 includes a stimulation source 90 that may be an infrared lamp, a laser in the 1.0 to 12.0 micron wavelength range, or other range, or some other stimulation source. In this illustrative embodiment, the stimulation source 90 may be an infrared lamp that is capable of projecting infrared radiation 95 toward the semiconductor chip 85. The lamp 90 may, but need not produce coherent radiation, and should be capable of delivering about 2.0 W/cm² of power. At this power level, a 5 to 10° C. localized temperature increase may be created in the chip 85. A shutter system 100 is interposed between the lamp 90 and the semiconductor chip 85 to selectively cover various portions of the semiconductor chip 85. For example, in FIG. 4, the shutter system 100 is set to obscure all but a corner portion 105 of the semiconductor chip 85. The shutter system 100 may consist of one or more shutter plates, two of which are depicted and labeled 110 and 115 respectively. The shutter plates 110 and 115 may be located in different vertical positions as shown and each may be operable along one or more axes, such as the X and Y-axes depicted in FIG. 4. The shutter plates 110 and 115 may be fabricated from a variety of materials, such as metals, plastics, ceramics or others.

The semiconductor chip 85 may be coupled to a semiconductor chip package 120 that is connected to a computer system 125 capable of electrically stimulating the semiconductor chip 85 by way of a plurality of test patterns or scripts that are run when selected portions, such as the portion 105, of the chip 85 are exposed to the radiation 95. The test patterns may exercise any aspects of the chip 85, such as floating point calculations, memory management, input output functions, analog processing and power management to name just a few. The computer system 125 may be a general purpose computer or a computing device specifically tailored for test pattern execution, and should include one or more processors distinct from the semiconductor chip 85. Optionally, an optics system 127 may be placed in the pathway of the lamp 90 and may include one or more lenses and/or filters to alter the characteristics of the radiation 95.

Figure 5:
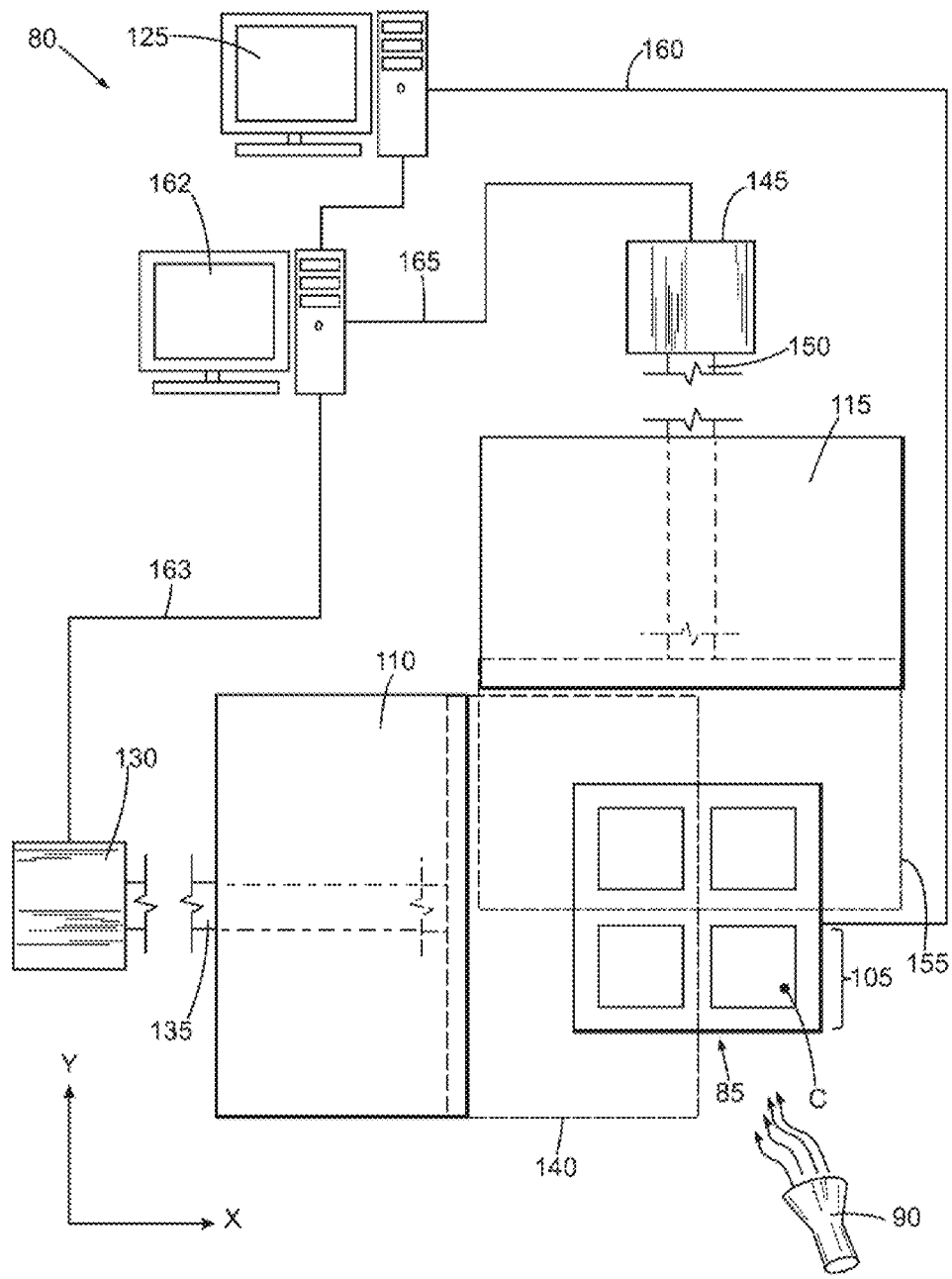
FIG. 5 is an overhead view showing a semiconductor chip and the exemplary embodiment of a defect scanning system.

Additional details of the system 80 may be understood by referring now also to FIG. 5, which is an overhead view showing the semiconductor chip 85 without the package substrate 120 depicted in FIG. 4, as well as the computer system 125, the two shutter plates 110 and 115 of the shutter system 100 and the lamp 90. The shutter plate 110 may be connected to an actuator 130 capable of two-axis movement by way of a shaft 135 or other member. The shaft 135 may be of such length that it is appropriate to show it broken. The shutter plate 110 is thus movable from the position shown to multiple positions, such as the extended position along the X-axis represented by the dashed box 140. The shutter plate 115 is similarly coupled to an actuator 145 also capable of two-axis movement by way of a shaft or member 150 that is again shown broken. Like the shutter plate 110, the shutter plate 115 is movable over the semiconductor chip 85 as indicated by the dashed box 155. As noted above, the semiconductor chip 85 may be electrically connected to the computer system 125 by way of a line 160. If desired, a second computer system 162 may be provided to control the movements of the actuators 130 and 145 by way of respective control lines 163 and 165, and may be tied to the other computer system 125. Optionally, the functions of the computer systems 125 and 162 may be combined into a single system. For purposes of this illustration, it is assumed that a soft defect C exists in the portion 105 of the semiconductor chip 85.

Figure 6:
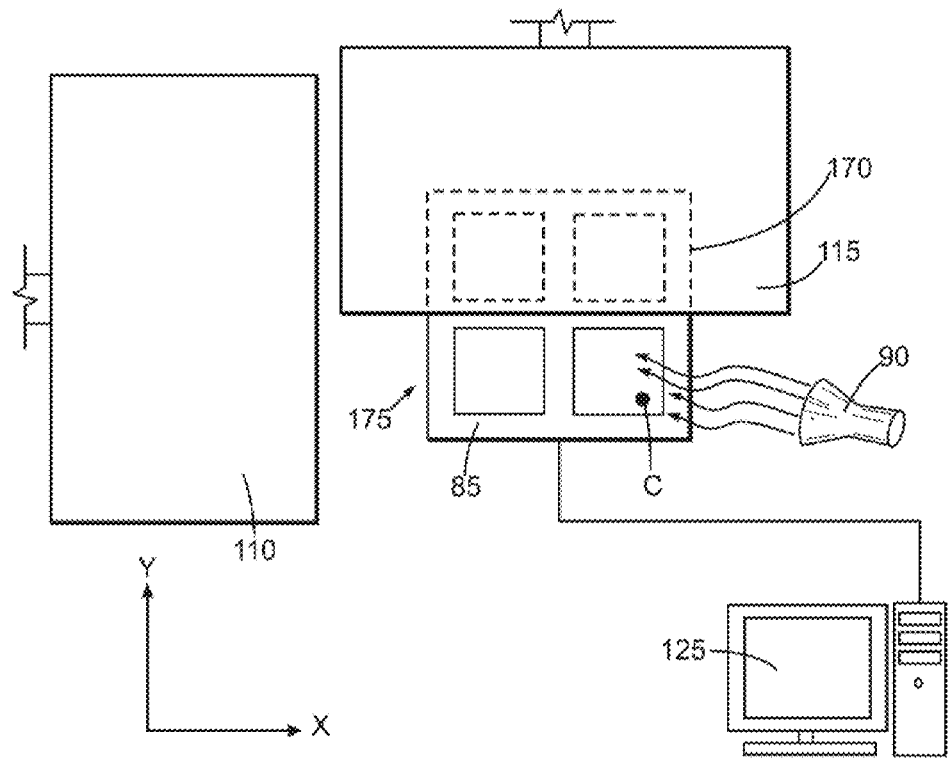
FIG. 6 is another overhead view showing a semiconductor chip and the exemplary embodiment of a defect scanning system.
Figure 7:
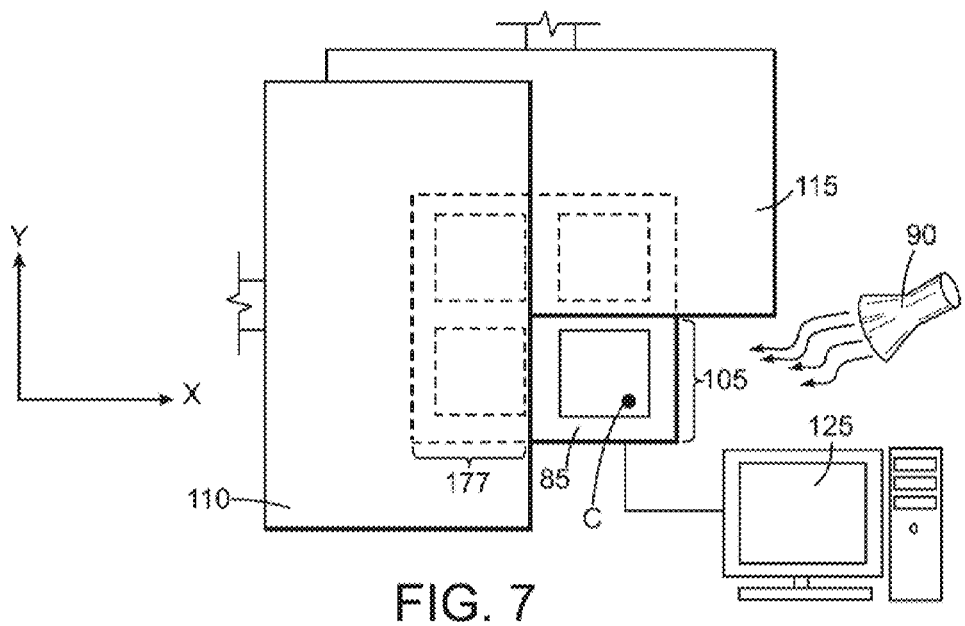
FIG. 7 is another overhead view showing a semiconductor chip and the exemplary embodiment of a defect scanning system.

The operation of the system 80 may be understood by referring now to FIGS. 6 and 7. FIG. 6 is an overhead view of the semiconductor chip 85, the two shutter plates 110 and 115 and the computer system 125. Note that the actuators 130 and 145 depicted in FIG. 5 are not shown for simplicity of illustration. Prior to testing the chip 85, deprocessing may be necessary to enable the infrared radiation to penetrate sufficiently into the surface of the chip 85. This may involve etches, lapping or the like. In order to track down the location of the soft defect C, a fractional portion 170 of the chip 85 is obscured by moving the shutter plate 115 over the chip 85 while the remaining fractional portion 175 of the chip 85 is left exposed. At this point, the lamp 90 may be activated and one or more test patterns may be run in the chip 85 by way of the computer system 125. If the soft defect C is located in the fractional portion 175 of the chip 85, then the test patterns will likely produce a measurable defect. The location of the soft defect C will thus be narrowed from somewhere in the entirety of the chip 85 to just the fractional portion 175 that was exposed during the initial test run. If no defect is present in the fractional portion 175, then the process may be reversed so that the fractional portion 175 is covered, the fractional portion 170 is exposed and another set of test patterns run concurrent with stimulation by the lamp 90. If a soft defect is located in the fractional portion 170 of the chip 85, then further localization may be performed. Assuming that the soft defect C is detected somewhere in the fractional portion 175, additional testing may be performed on just the fractional portion 175 to further localize the position of the soft defect C. In this regard, the shutter plate 110 may be moved along the X-axis over the chip 85 so that only the fractional portion 105 is exposed as shown in FIG. 7. At this point, the lamp 90 and computer system are again activated to apply one or more test patterns to the chip 85. If the soft defect C is located in the fractional portion 105 of the chip 85, the test patterns will register a computational anomaly and the location of the soft defect C will be pegged to the fractional portion 105 of the chip 85. If, however, no defect is apparent from the test patterns, then the fractional portion 105 of the chip 85 may be ruled out and testing activity turned to the remaining portion 177 of the chip 85 that has not undergone infrared perturbation.

Thus, the general technique involves applying an external stimulus to a series of fractional portions 170, 175 and 105 of the chip 85 where at least one of the fractional portions, namely the fractional portion 105, is smaller than one or more of the others 170 and 175. In this way, the testing proceeds from the large to the small. Even if only two fractional portions 170 and 175 are selected to cover one half each of the chip 85, one will be smaller than the other due to inherent errors in the positioning of the shutters 110 and 115. The difference may be quite small.

Once the position of the defect C is narrowed to a desirably sized region using the shutter system 100, a more precise location of the defect C may be attained by subjecting the chip 85 to laser scanning microscopy using, for example, the conventional system 10 depicted in FIG. 1. In this case, the pixel-by-pixel scanning associated with the conventional system 10 need not be used on the entirety of the chip 85, but rather some remarkably smaller portion thereof that has been localized using the new system 80 and techniques disclosed herein. A variety of infrared laser wavelengths may be used for the follow-on pixel-by-pixel test. For example, a 1.0 micron wavelength corresponds to the bandgap for electron hole pair formation in the silicon. If thermal excitation only is desired, a wavelength below the electron hole pair creating bandgap may be used, such as 1.32 microns.

Considerable flexibility in the sequence of tests is possible. For example, the chip 85 may be tested one half at a time, one third at a time, one quarter at a time and so on. Overall efficiency may be enhanced if initial testing focuses on large blocks of the chip 85 followed by smaller blocks as necessary.

Figure 8:
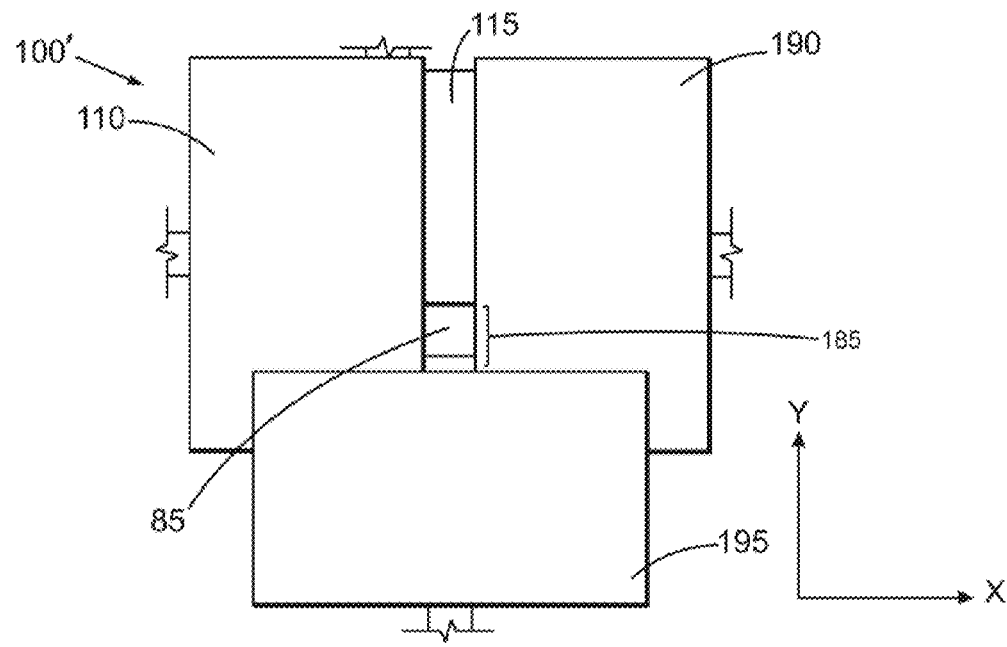
FIG. 8 is another overhead of another embodiment of an exemplary defect scanning system.

In the embodiment depicted in FIGS. 4-7, a shutter system 100 consisting of two two-axis shutter plates 110 and 115 may be used to selectively cover/expose portions of the chip 85. However, more than two shutter plates may be used. Attention is now turned to FIG. 8, which is an overhead view of a shutter system 100' positioned over the semiconductor chip 85 and activated so that only a small portion 185 of the chip 85 is exposed. In this case, the shutter system 100' may include the two shutter plates 110 and 115 as previously disclosed, and two additional shutter plates 190 and 195 that may be configured like the shutter plates 110 and 115. The shutter plates 110, 115, 190 and 195 may be capable of two-axis movement. However, with the use of four plates 110, 115, 190 and 195, each plate need only be capable of single-axis movement, that is, along either the X-axis or the Y-axis, in order to provide a selectively moveable opening through which radiation may be transmitted to the chip 85.

Figure 9:
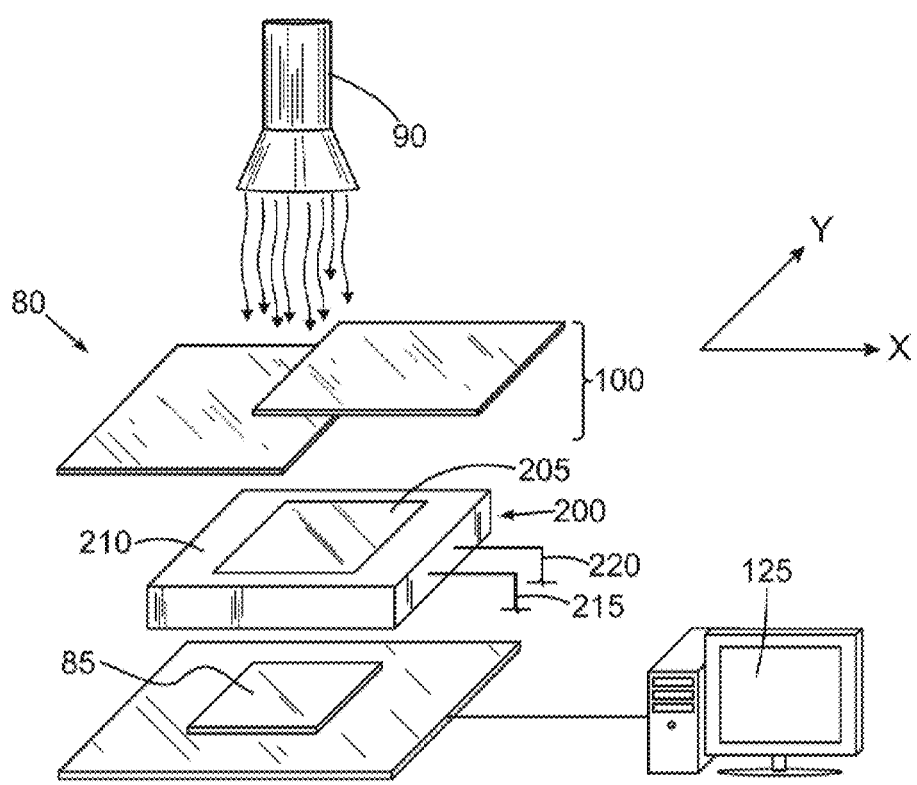
FIG. 9 is a partially exploded pictorial of another embodiment of a defect scanning system.

A given semiconductor chip may dissipate substantial quantities of thermal power. In such cases, it may be appropriate to provide a cooling solution for the chip that prevents thermal damage and/or shutdown while permitting the thermal perturbation testing described herein. In this regard, attention is now turned to FIG. 9, which is a partially exploded pictorial view of the system 80 that is again provided with a thermal lamp 90 and a shutter system 100 that are used to selectively illuminate portions of a packaged semiconductor chip 85. Electrical stimulation by way of test patterns is again provided by a computer system 125. However, in this illustrative embodiment, a cooling device or cold plate 200 may be positioned on the chip 85 beneath the shutter system 100. The cold plate 200 may be provided with an infrared transparent window 205 and a body 210. The body 210 may be formed of a thermally conductive material, such as copper, aluminum, nickel or the like, and cooled by fluid flow via coolant supply and return lines 215 and 220. Optionally, the lines 215 and 220 may be leads of a thermoelectric cooling system. Regardless of the configuration, the goal is to cool all portions of the chip 85 while certain portions are perturbed by the radiation from the lamp 90. The window 205 may be composed of, for example, diamond, sapphire or the like. The window 205 should have good transparency to infrared radiation and in the case of diamond, will have advantageous thermal conductivity so that the semiconductor chip 85 may be relieved of excess heat during the testing phase. Again, the shutter plates 110 and 115 of the shutter system 100 may be movable along the X and Y-axes or in the X-Y plane.

Figure 10:
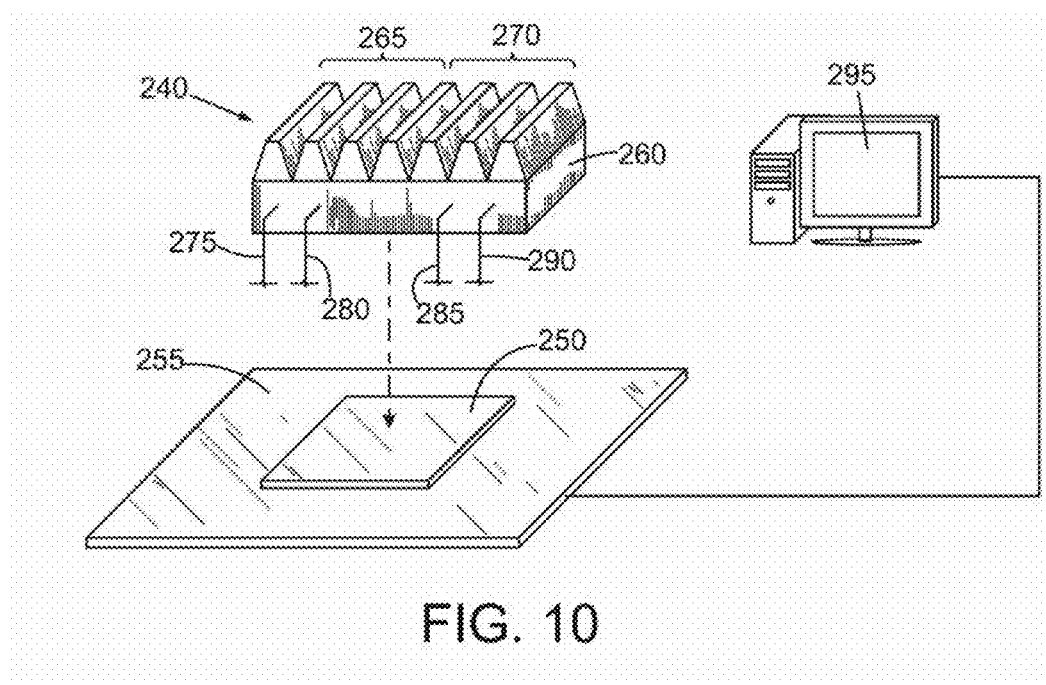
FIG. 10 is a partially exploded pictorial of another embodiment of a defect scanning system.

In the foregoing illustrative embodiments, an infrared lamp or infrared laser is used to provide the requisite perturbations to various portions of a semiconductor chip for purposes of locating a soft defect therein. However, another form of stimulation may be used in order to provide the requisite perturbation to various circuit structures. In this regard, FIG. 10 depicts an exemplary embodiment of a testing system 240, which is operable to selectively perturb portions of a semiconductor chip 250 that may be mounted on a package substrate 255 as shown. The system 240 may include a heat exchanger 260 that has two separate thermal zones 265 and 270 each of which may be heated or cooled to selective temperatures. In this regard, the zone 265 may include fluid supply or return lines 275 and 280 and the zone 270 may be provided with corresponding fluid supply and return lines 285 and 290. In this way, the heat exchanger 260 may be seated on the chip 250 and the temperature of the zone 265 may be raised to some elevated temperature. Then a computer system 295, which is electrically connected to the chip 250 may be operated to run one or more test patterns and to try to identify the location of any soft defects in the fractional portion of the chip that is seated beneath the zone 265. Subsequently, the zone 270 may be activated and raised to an elevated temperature and additional test patterns may be run from the computer system 295 to locate any defects that may be in the fractional portion of the chip 250 that is beneath the zone 270 of the heat exchanger 260. In this way, a soft defect may be localized to one half or another or some other fractional portion of the chip 250 quickly and thereafter that smaller portion of the chip 250 may be subjected to laser scanning microscopy as described elsewhere herein for a more precise localization of a soft defect.

Figure 11A:
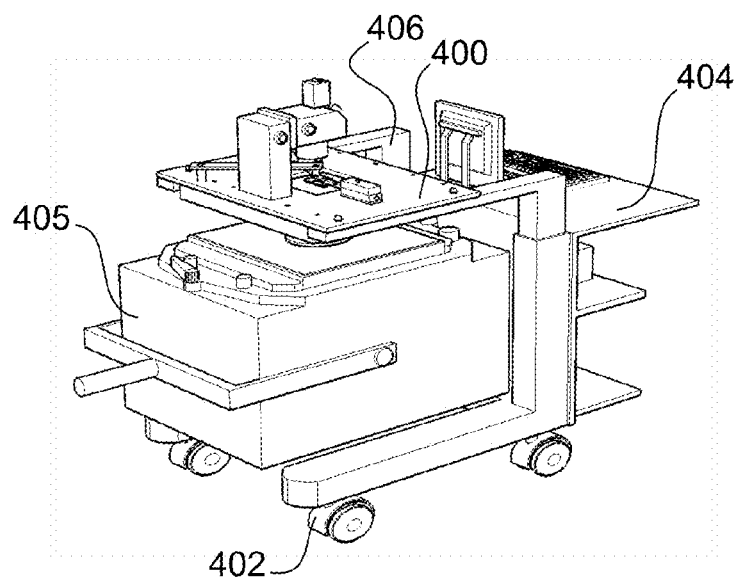
FIGS. 11a-d depict an embodiment of a defect scanning system including a mobile support.
Figure 11B:
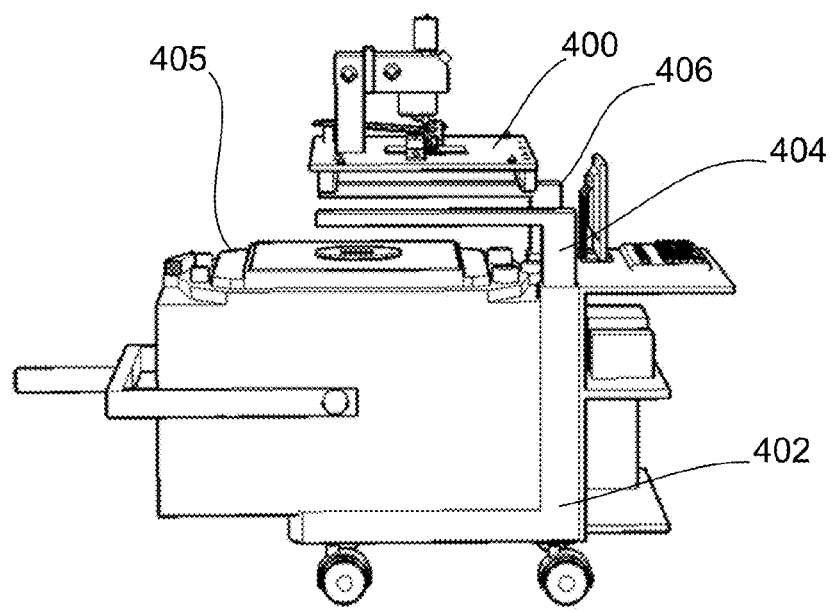
Figure 11C:
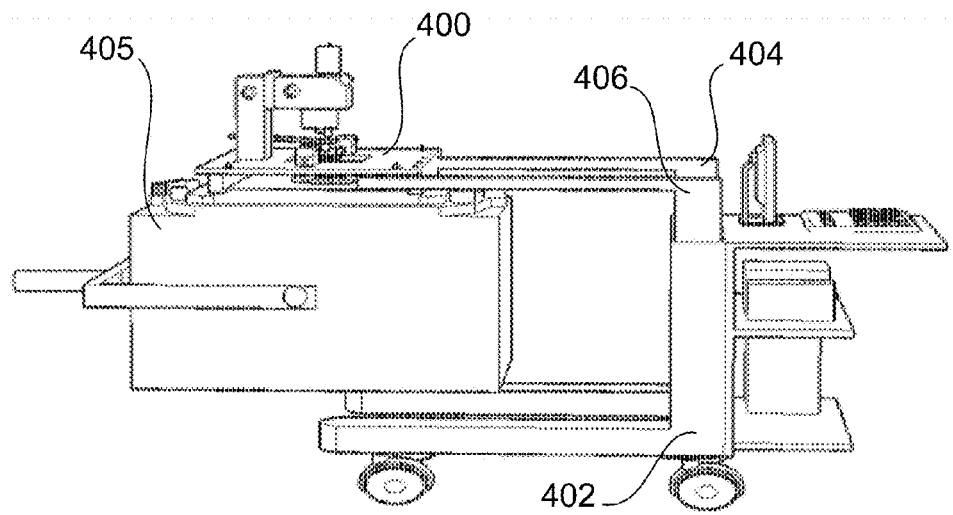
Figure 11D:
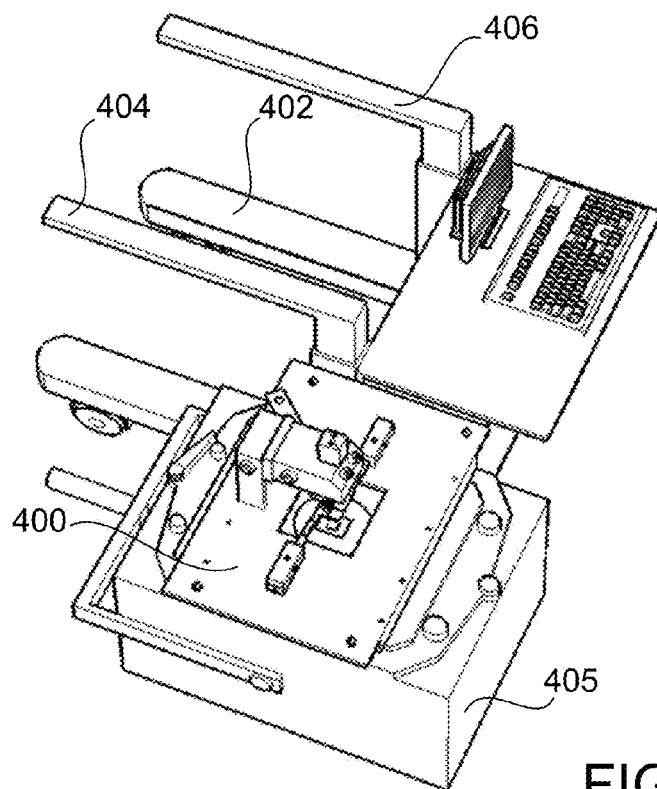

With reference to FIGS. 11*a-d*, a mobile GCTP platform 400 is supported on a mobile telescoping base 402. Vertical and/or horizontal telescoping supports 404 and 406 allow the mobile GCTP platform 400 to be lowered onto an ATE test head 405 or table on which an SLT or HST board are positioned. With reference to FIGS. 11*c-d*, the mobile GCTP platform 400 can be detached from the mobile telescoping base 402 after docking to the ATE test head 405.

Figure 12:
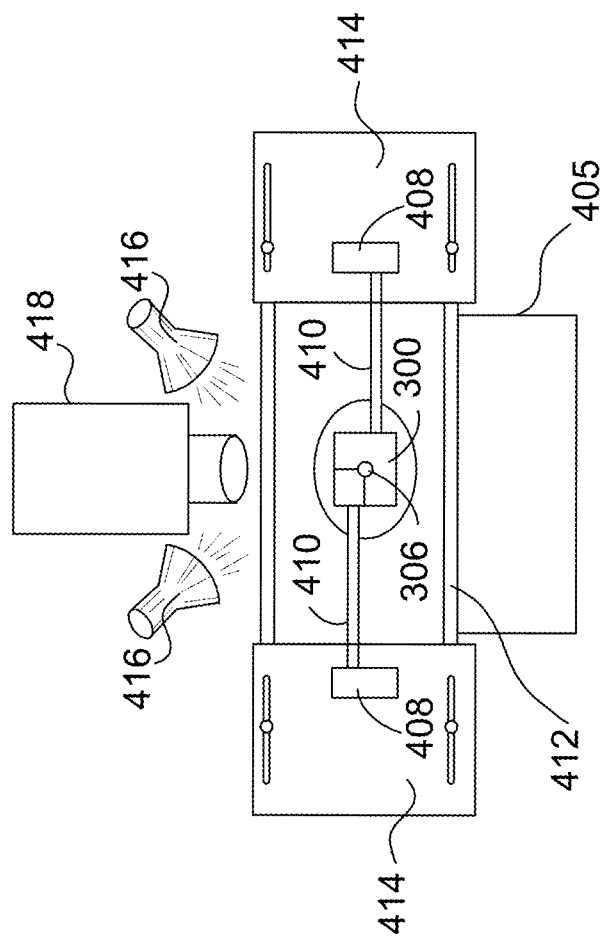
FIG. 12 is perspective view of a defect scanning system including an irradiation source, irradiation mask and imaging apparatus.

With reference to FIG. 12, mobile GCTP platform 400 includes multi-axis actuators/controllers 408 that serve to position complementary portions of a variable aperture irradiation mask 300 via supporting arms 410. The various platform components can be affixed to a platform-test head interface 412 that includes laterally adjustable side portions 414 to accommodate testing of multiple chips or provide other adjustment flexibility. Preconfigured interfaces 412 can be readily fitted to the various test heads to support the various platform GCTP components.

Multi-axis actuators 408 operable to position an irradiation mask 300 and can include a z-axis range for aligning the two upper mask portions in overlapping relation at a fixed distance from chip surface and x-y axis ranges for positioning mask 300 over a target exposure area of the chip surface. The exposure area can be repeatedly adjusted by varying the degree of mask portion overlap to achieve a methodical stepping scan pattern, a binary scan pattern, a refined or fractional quadrants scan pattern, or any other motion or scan pattern suitable to isolate fault locations.

An irradiation source 416 such as IR beams from IR heat lamps are directed towards an aperture 306 defined by the mask 300 and an imaging apparatus 418 is positioned above the aperture 306 to determine a precise position of the IR beam exposed area on the chip surface. Various energy sources or parameters, e.g., heat, power or wavelength, may be selected to affect different speed paths. In a particular implementation, the irradiation source 416 includes at least one of a 40 W.12 v SiN emitter; a 450 W.115V Heraeus IR heater (25 mm×15 mm heated emitter surface) and a 250 W home heating lamp. The various energy sources may be operated alone, simultaneously or in any suitable combination or sequence to affect the targeted area. In a particular implementation, the imaging apparatus 418 includes a zoom lens and an InGaAs camera for backside imaging.

Wide-range adjustability of the GCPT platform 400 and mask 300 accommodates use with motherboards, daughterboards, DIMS and various chipset arrangements. Various interface bases 412 may be preconfigured or adjustably configurable to interface or otherwise accommodate the various test heads 405, including clearance for associated circuit boards, VRMs or other hardware. For example, a dual-die interface base 412 with adjustable side portions 414 can allow for rapid repositioning of the mask 300, IR beams 416 and imaging apparatus 418 between the two die without having to move the dual-die circuit board. For example, releasable fasteners in corresponding slots 413 formed in side portions 414 allow for lateral travel of side portions 414 on interface 412 for repositioning over different chips of test areas.

Figure 13B:
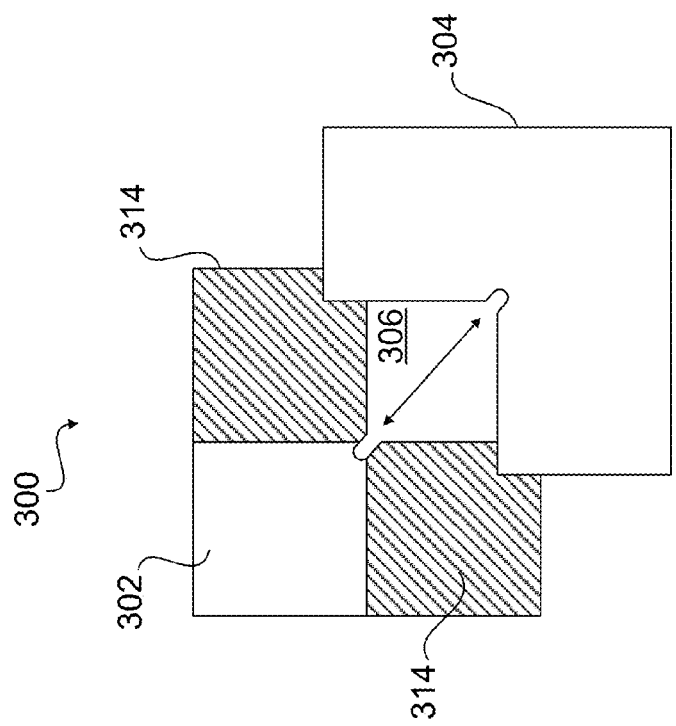
FIG. 13 is a perspective view of an embodiment of an irradiation mask.
Figure 13A:
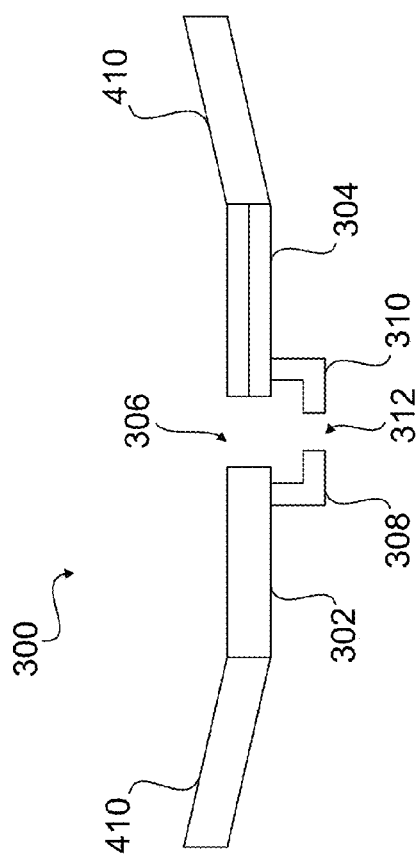
Figure 14:
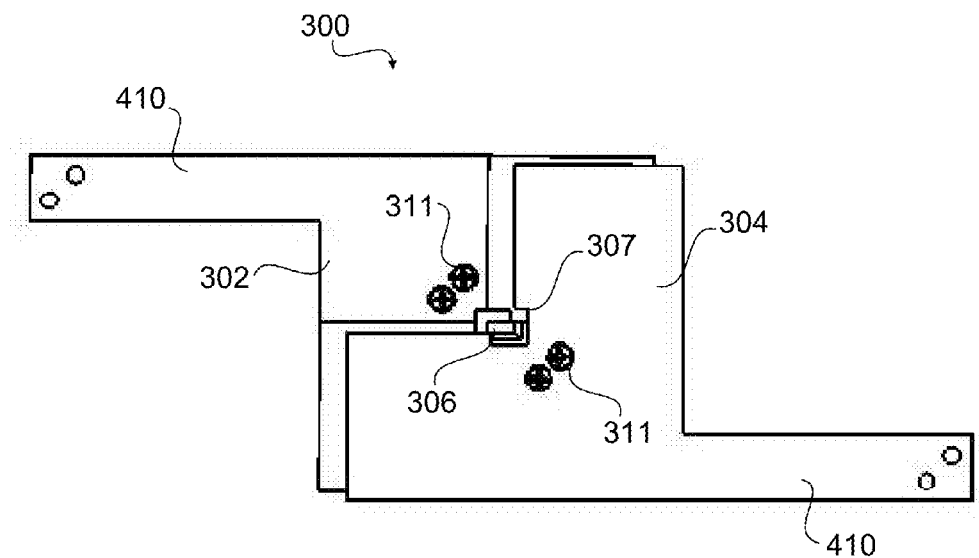
FIG. 14 is a top view of an embodiment of an irradiation mask.
Figure 15:
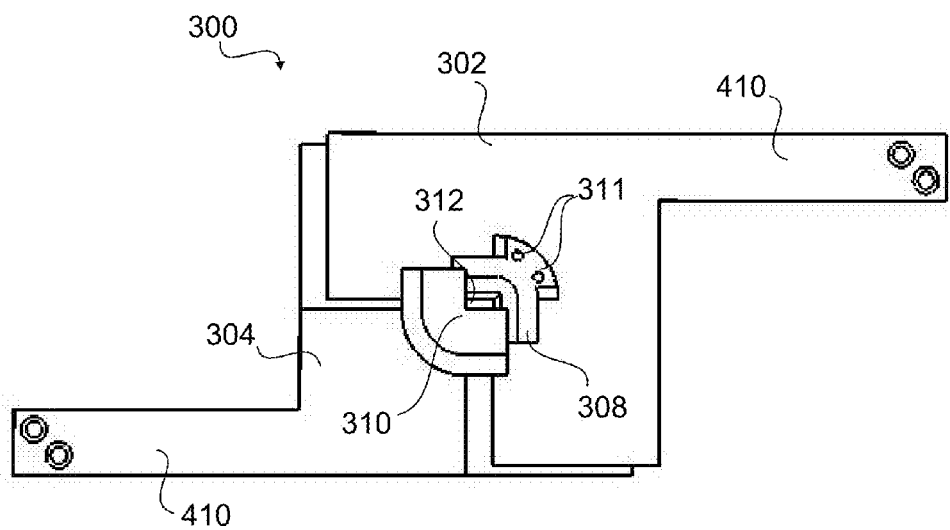
FIG. 15 is a bottom view of an embodiment of an irradiation mask.
Figure 16A:
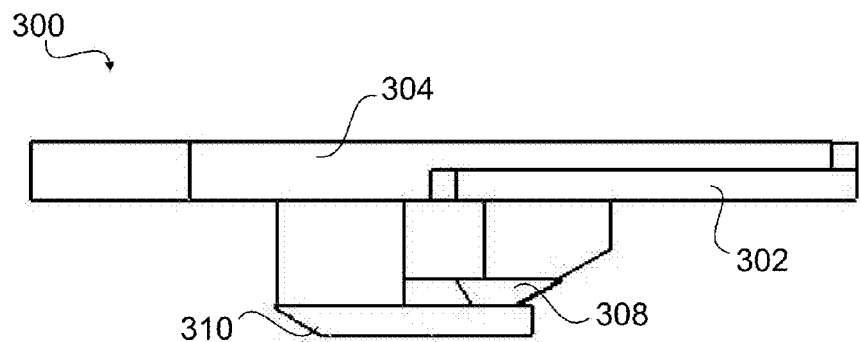
FIGS. 16a-b are a perspective view of an embodiment of an irradiation mask.
Figure 16B:
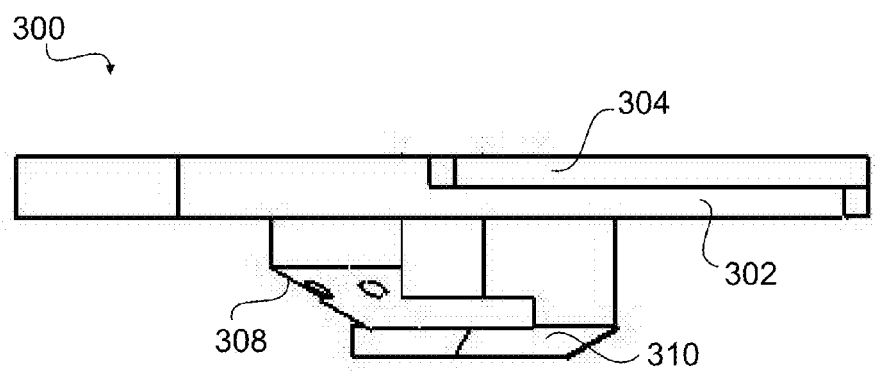
Figure 17:
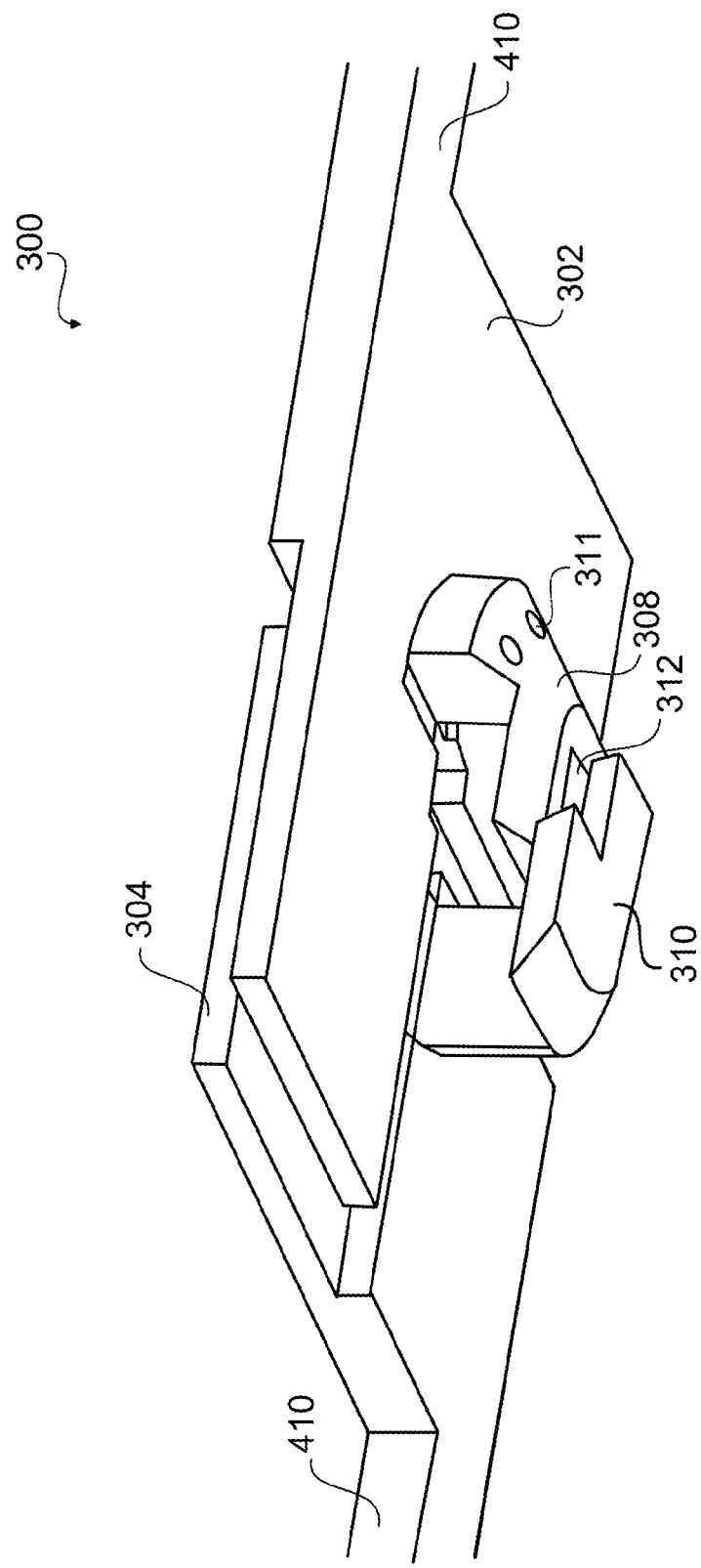
FIG. 17 is a perspective bottom view of an embodiment of an irradiation mask.

With reference to FIG. 13a, variable aperture irradiation mask 300, sometimes referred to as a shutter or plate system, includes first and second upper mask portions 302 and 304 defining a variable upper aperture 306. Mask 300 further includes first and second lower mask portions 308 and 310 defining a variable lower aperture 312. In some implementations, upper portions 302 and 304 include complementary stepped portions moveable in overlapping relation to vary the size of the apertures 306 and 312. In some implementations, the lower portions 308 and 310 extend inwardly beyond the upper aperture 306 such that the lower aperture 312 is smaller than the upper aperture 306.

Upper aperture 306 serves to collect the irradiation energy from an irradiation source while lower aperture 312 serves to precisely direct the collected energy to a selected fractional portion of a chip surface. Light tends to scatter or diffuse as it passes through a single aperture. The dual aperture arrangement serves to mitigate diffusion of the irradiation energy, e.g., IR beam, beyond the target area of the chip surface.

In some implementations, mask portions 302 and 304 are constructed and arranged to fully enclose central aperture 306 defined therein. For example, with reference to FIG. 13b, a tiered (shaded) portion 314 of upper mask portion 302 may be positioned to pass under a lower faces of the upper mask portion 304. For example, three quadrants of the total top surface of upper mask area may be defined by mask portion 304 while the fourth quadrant is defined by the other complementary mask portion 302, with the tiered or layered portion 314 of mask portion 302 extending under the two adjacent quadrants of mask portion 304 to fully enclose the perimeter of the aperture 306 defined between the two upper mask portions 302 and 304. In some implementations, the lower mask portions 308 and 310 can include a similar layered or tiered structure and can be affixed to the upper mask portions 302 and 304 for accurate positioning.

The masks are preferably formed of a heat resistant material suitable to withstand close proximity irradiation from IR beams or the various other selected energy sources for a given testing application. For example, metal, glass and ceramic materials can readily withstand 450 W irradiation at close range. While the upper and lower masks have been described in the example context of multiple associated components, the upper and lower apertures may suitably be provided, in some implementations, by a unitary structure, e.g., a tapered or conical aperture structure, though such structures may provide a lesser range of variation of exposure area sizes.

The multi-axis controllers 408 can be used, in some implementations, to provide a wide range of variability of IR beam exposure. In a particular example, the controller 408 may be operated to position a lower aperture of the mask 2 mm from the die surface with an upper aperture of the mask 8 to 15 mm from the die surface. The lower masks can be positioned to provide an exposure aperture of 0.05 mm while the upper masks are positioned slightly further apart, e.g., 4 mm, to allow increased IR beam energy through to the die surface. In some applications, the mask sets can control the IR beam exposure to sub millimeter die areas. Controllers 408 can be used to vary the degree of overlap of the mask portions to thereby size apertures 306 and 312. Controllers 408 can also be used to vertically and horizontally position the mask 300 relative to the die surface.

With reference to FIGS. 14-17, variable aperture irradiation mask 300, includes first and second overlapping upper mask portions 302 and 304 defining a variable upper aperture 306. Portions 302 and 304 are supported by arms 410. Mask 300 further includes first and second lower mask portions 308 and 310 defining a variable lower aperture 312. Lower portions 308 and 310 can extend inwardly beyond the upper aperture 306 such that the lower aperture 312 is smaller than the upper aperture 306. Lower portions 308 and 310 can be attached to respective upper mask portions via fasteners 311. Alternatively, upper and lower mask portions may be integrally formed, adhered, or otherwise suitably connected. In an alternative implementations, lower masks are not supported directly by the upper mask portions, e.g., for independent variability.

Similar to the overlapped arrangement of upper portions 302 and 304, lower mask portions 308 and 310 may be overlapping in some implementations. In some cases, lower mask portions 308 and 310 fully enclose lower variable aperture 312. In other cases, lower variable aperture 312 may be only partially enclosed by lower mask portions 308 and 310, for example, when upper mask portions are in a minimally overlapping arrangement. Lower mask portions 308 and 310 may remain in overlapping relation over a range of overlap of upper mask portions 302 and 304.

In some implementations, upper surfaces 304 and/or 302 define a recessed portion 307 of aperture 306. In some cases, for example, with maximum overlap, recessed portion 307 substantially defines aperture 306. Stated otherwise, recessed portion 307 can define a smallest size or small range of sizes of aperture 306. Recessed portion 307 can serve to define a minimum size of aperture 306 in a fully overlapped position of upper mask portions 302 and 304 to more finely control irradiation of fractional portions of the chip surface.

Lower portions 308 and 310 are depicted with curved and/ or tapered outer contours. Such contours can be advantageous, for example, in accommodating close proximity positioning adjacent a complimentary contour of a cooling device positioned adjacent the chip surface.

With reference to FIG. 18, in some implementations, a cooling apparatus 500 is positioned over the chip to be tested and the mask portions 302 and 304 are constructed and arranged to be variably positionable adjacent the chip surface within a confining perimeter of the cooling apparatus 500. (See also FIG. 9 re cooling apparatus 200). In a particular implementation, the cooling apparatus 500 is a heat sink ring defining an 8-12 mm cavity under which the test chip is positioned. The mask portions 308 and 310 are adjustable within the cavity and mask portions 302 and 304 are adjustable above the cavity to selectively expose target areas of the chip surface.

In some implementations, at least the lower mask portions 308 and 310 are constructed and arranged to nest within or substantially conform to a contoured, e.g., tapered, portion of the cooling cavity 500. For example, the upper mask portions 302 and 304 may be positioned entirely above the cooling cavity walls while the lower mask portions 308 and 310 may be constructed and arranged to be retracted or moved side-to-side into near contact with corners or other features of the cavity of the cooling device 500. Additionally, mask sets can be readily exchanged to cooperate with various cooling solutions, e.g., to accommodate different cooling cavity depths, widths, or other dimensions. For example, a particular cooling solution may require greater spacing to maintain proximity of the lower mask aperture while the upper mask is substantially flush with the top of the cooling cavity.

With reference to FIG. 19, a table of fractional section test results are shown, including coordinates for positioning of mask portions 302 and 304, irradiation source type, irradiation duration, and critical timing path test counts and pass-fail rates. Different aperture sized can be selected by positioning of mask portions 302 and 304 according to a targeted fractional chip section and the selected irradiation source and duration.

Virtually any type of semiconductor chip may be tested using the techniques disclosed herein, such as microprocessors, graphics processors, combined microprocessor/graphics processors, memory devices, application specific integrated circuits or the like. Such devices may be used with multiple cores and multiple dice. It should also be understood that the shutter systems 100 and 100' disclosed herein may be manually operated, that is, by hand input from an operator.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of testing a semiconductor chip having a surface and plural circuit structures positioned beneath the surface, comprising:
    positioning moveable complementary portions of an irradiation mask for selective irradiation of a series of fractional portions of the chip surface, the irradiation mask comprising a set of overlapping upper mask portions defining a first larger variable aperture and a set of lower mask portions defining a second smaller variable aperture for mitigating diffusion of radiation beyond a target fractional portion of the chip surface area;
    selectively irradiating a series of fractional portions of the surface, the fractional portions defined via the positioning, to perturb respective circuit structures; and
    causing the semiconductor chip to undergo tests during the irradiation of the fractional portions to determine if a soft defect exists in the respective circuit structures of any of the fractional portions.

2. The method of claim 1, wherein a first of the upper mask portions includes a stepped structure defining a first portion of the larger variable aperture and a second of the upper mask portions includes a complementary stepped structure defining a second portion of the larger variable aperture and the positioning includes overlapping the stepped portions to provide a substantially planar surface surrounding a major portion of the larger variable aperture.

3. The method of claim 1, wherein the positioning comprises varying a size of at least one of the apertures between irradiation of at least two fractional portions.

4. The method of claim 3, wherein at least one of the series of fractional portions is smaller than another of the series of fractional portions.

5. The method of claim 1, wherein the tests include testing multiple circuit paths simultaneously.

6. The method of claim 5, further comprising using a subsequent single critical timing path test to further isolate a soft defect to an individual one of the multiple circuit paths.

7. The method of claim 1, further comprising positioning a cooling device adjacent the semiconductor chip during the irradiating, the cooling device comprising sidewalls defining a cavity, the method further comprising positioning at least the lower mask portions within the cooling device cavity during the irradiation.

8. The method of claim 7, wherein a lower mask portion substantially conforms to a contour of the cavity to accommodate positioning of the lower mask portion in close proximity to the cavity sidewall.

9. The method of claim 7, wherein an upper mask portion extends beyond the cavity while the lower mask portions are positionable substantially within the cavity during irradiation.

10. The method of claim 7, wherein the larger aperture is sized to collect a first amount of irradiation energy sufficient to perturb a target fractional portion and the smaller aperture is sized to precisely direct the collected irradiation energy to the target fractional portion.

11. The method of claim 1, wherein varying a degree of overlap of the upper mask portions varies the perimeter of the larger aperture.

12. An apparatus for testing a semiconductor chip having a surface and plural circuit structures positioned beneath the surface, comprising:
    an irradiation source operable to stimulate a series of fractional portions of the surface to perturb respective circuit structures during soft defect testing; and
    an irradiation mask comprising complementary upper mask portions moveable in overlapping relation to define a first larger variable aperture and a set of lower mask portions moveable to define a second smaller variable aperture.

13. The apparatus of claim 12, wherein a first of the upper mask portions includes a stepped structure defining a first portion of the larger variable aperture and a second of the upper mask portions includes a complementary stepped structure defining a second portion of the larger variable aperture whereby the overlapped stepped portions together comprise a substantially planar surface surrounding a major portion of the larger variable aperture.

14. The apparatus of claim 13, wherein the lower mask portions overlap to define the smaller aperture to mitigate diffusion of radiation at the chip surface.

15. The apparatus of claim 12, comprising a cooling device to cool the semiconductor chip during the irradiation; wherein at least one of the lower mask portions is contoured to nest in close proximity to a cooling device contour during testing.

16. The apparatus of claim 12, wherein the lower mask portions are supported by the upper mask portions and extend inwardly beyond the perimeter of the larger aperture to define the smaller aperture.

17. The apparatus of claim 12, wherein the upper mask portions include opposed recesses defining the larger aperture when the upper mask portions are in a fully overlapped position.

18. The apparatus of claim 12, wherein the degree of overlap of the upper mask portions determines the size of the larger and smaller apertures.

19. A method for multi-path testing of fractional portions of a semiconductor chip having a surface and plural circuit structures, the method comprising:
  positioning an irradiation source to irradiate the chip surface;
  positioning an irradiation mask to direct irradiation energy from the irradiation source to select fractional portions of the chip surface during testing, the mask comprising adjustable portions defining first and second variable apertures, the first variable aperture positionable closer to the irradiation source to collect irradiation energy, the second variable aperture positionable closer to the chip surface to precisely direct the collected irradiation energy to a selected portion of the chip surface during testing; and
  simultaneously testing multiple paths within the circuit structures for soft defects while irradiating the chip surface.

20. The method of claim 19, further comprising positioning the irradiation mask in close proximity to a cooling device adjacent the chip surface, wherein a contour of the irradiation mask substantially conforms to a contour of the cooling device to accommodate the close proximity positioning.

21. The method of claim 19, wherein the irradiating includes irradiation of substantially different wavelengths.

* * * * *